United States Patent [19]

Wysome

[11] Patent Number: 5,585,808
[45] Date of Patent: Dec. 17, 1996

[54] TEST APPARATUS FOR TESTING THE SUSCEPTIBILITY OF ELECTRONIC EQUIPMENT TO ELECTROMAGNETIC RADIATION AND FOR MEASURING ELECTROMAGNETIC RADIATION EMITTED BY ELECTRONIC EQUIPMENT

[75] Inventor: Richard A. Wysome, Devon, United Kingdom

[73] Assignee: Comtest Limited, Hampshire, United Kingdom

[21] Appl. No.: 354,922

[22] Filed: Dec. 13, 1994

[51] Int. Cl.$^6$ ................................................. H01Q 17/00
[52] U.S. Cl. ................................................................. 343/703
[58] Field of Search .................................. 343/703, 853; H01Q 17/00

[56] References Cited

U.S. PATENT DOCUMENTS

| | | | |
|---|---|---|---|
| 3,806,943 | 4/1974 | Holloway | 343/703 |
| 4,837,581 | 6/1989 | Hansen et al. | 343/703 |
| 5,001,494 | 3/1991 | Dolman et al. | 343/703 |
| 5,300,939 | 4/1994 | Maeda et al. | 343/703 |
| 5,430,456 | 7/1995 | Osburn et al. | 343/703 |

FOREIGN PATENT DOCUMENTS

| | | | |
|---|---|---|---|
| 028156 | 11/1990 | Japan | 343/703 |

OTHER PUBLICATIONS

European Standard: Immunity from Radio Interference of Broadcast Receivers and Associated Equipment, published by European Committee for Electrotechnical Standardization, pp. 1–60, Mar. 1991.

Sales Brochure: Antennas & Accessories for EMC Testing—"Field Generating Devices TEM CELL", Electro–Metrics Ltd., Shefford, Bedfordshire, pp. 96–109 (undated).

*Primary Examiner*—Donald T. Hajec
*Assistant Examiner*—Tho Phan
*Attorney, Agent, or Firm*—Westman, Champlin & Kelly, P.A.

[57] ABSTRACT

EMC test apparatus for EMC testing electronic equipment comprises an electromagnetic screening enclosure for receiving the electronic equipment and a stripline antenna suspended within the enclosure and extending thereacross. The stripline antenna has a width less than half the wavelength of the highest frequency of the electromagnetic radiation at which EMC testing is to take place. Electrical connectors are provided through the enclosure to allow the connection of EMC test equipment to the stripline antenna.

26 Claims, 5 Drawing Sheets

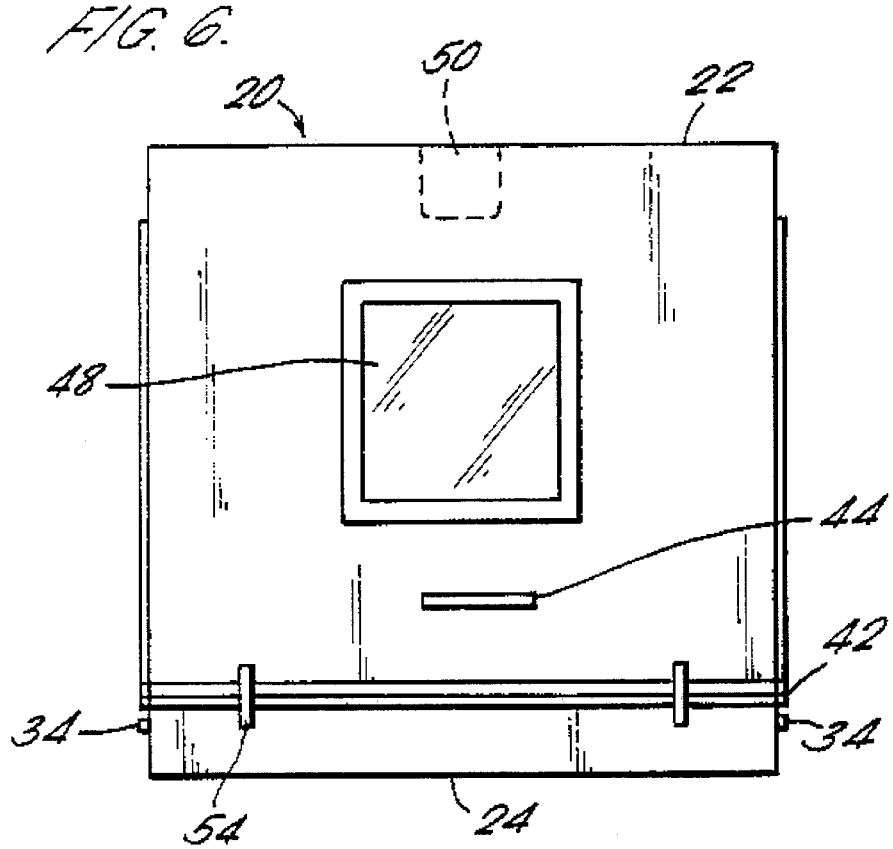
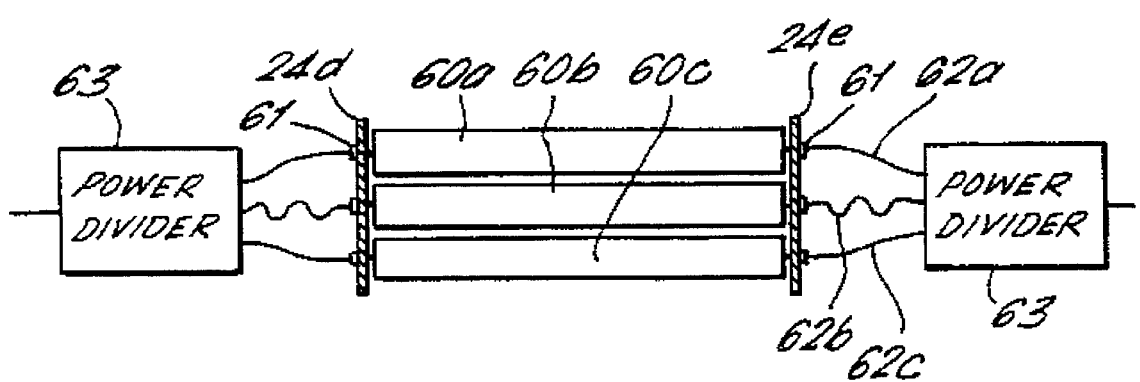

TEST APPARATUS FOR TESTING THE SUSCEPTIBILITY OF ELECTRONIC EQUIPMENT TO ELECTROMAGNETIC RADIATION AND FOR MEASURING ELECTROMAGNETIC RADIATION EMITTED BY ELECTRONIC EQUIPMENT

BACKGROUND OF THE INVENTION

1. Field of the Invention

The present invention relates to test apparatus for Electromagnetic Compatibility (EMC) testing of electronic equipment, and more particularly to the use of a stripline antenna having a width of less than half the wavelength of the highest frequency of the electromagnetic radiation, suspended within an enclosure into which is placed the electronic equipment to be tested.

2. Description of the Prior Art

The constraints being put on the manufacturers of electronic equipment with regard to the susceptibility of electronic equipment to electromagnetic radiation and the levels of electromagnetic radiation which are allowed to be emitted from electronic equipment have recently become more stringent. Particularly in Europe, a directive is due to come into force which requires all manufacturers of electronic equipment to certify that their products neither emit RF energy nor are susceptible to it, within given limits. The proliferation of electronic equipment e.g. mobile telephones, facsimile machines, video recorders, etc. has made the subject of Electromagnetic Compatibility (EMC) more relevant for the commercial and industrial world. The military have been involved in this field for a very long time and most of the test methods and failure criticism are derived from their experience.

In view of the more stringent requirements for EMC, many manufacturers have decided to carry out the necessary tests themselves rather than relying on specialist consultants for example.

There is therefore a need for inexpensive and simple EMC test equipment.

The European Standard which has been ratified by CENELEC, which is a directive which has been brought into force within Europe, an arrangement for measuring the susceptibility of electronic equipment to electromagnetic radiation is disclosed and stated as being the standard arrangement which is to be used for EMC testing. The test arrangement disclosed in the directive is shown schematically in FIG. 1 and the specific proposed configuration is shown in FIG. 2.

In order to test electronic equipment the aim is to generate a homogeneous electromagnetic wave under free space conditions. This can be simulated by a guided wave of the TEM (Tranverse Electromagnetic) mode travelling between two flat conducting plates. In this case the electric field component is perpendicular, and the magnetic field component parallel to the conductors.

As can be seen generally in FIG. 1 with the more detailed constructional details given in FIG. 2, the stripline TEM device comprises two spaced parallel metal plates 1 and 2. The RF field is applied by an RF generator 6 across the plates 1 and 2 and a terminating impedance 7 is provided to complete the circuit.

FIG. 2 shows the suggested constructional details wherein the two plates 1 and 2 are spaced by plastic bracings 3. A non-metallic support 4 is provided on to which the electronic equipment 5 undergoing tests can be placed.

It is stated in the standard that this construction is usable up to 150 MHz. This is severely limiting since it is necessary for some electrical equipment to be tested at higher frequencies.

One commercial form of the TEM cell is the range of EMCO TEM cells available from Electro-Metrics Limited of Shefford in the United Kingdom. The range of TEM cells can provide for EMC testing in the ranges DC to 100 MHz to DC to 500 MHz depending on the size of the TEM cell. The EMCO Model 5101 TEM cell is the model which is capable of operating in the frequency range DC to 500 MHz. The dimensions of this cell are 30.48 cm sq. Thus although the frequency range available for EMC testing is as high as 500 MHz, the size of electronic equipment which can be tested is extremely limited. This is an inherent limitation of the TEM cell design. In order to provide the required simulated homogeneous electromagnetic waves under free space conditions within the parallel plate design of the TEM cell for high frequencies it is necessary to reduce the dimensions of the plate. It is not possible to construct such a TEM cell of useful capacity for a higher frequency operation.

For EMC testing at higher frequencies well into the GHz range, Electro-Metrics Limited have developed the GTEM! (Trade Mark) cell. Three different sizes of GTEM! are available, the smallest of which is illustrated in FIG. 3 and has a length of some 3 meters, a width of 1.6 meters and and height of 1.7 meters but provides only a useful internal height of 0.5 meters.

As can be seen in FIG. 3, the GTEM! comprises a flared enclosure which tapers out from the input end 10. This arrangement comprises a tapered stripline 11 the impedance of which is carefully matched. At the far end of the cell there is provided RF absorptive material 12 to terminate propagating waves. The small taper of the cell propagates an undistorted evenly distributed TEM wave without propagating higher order modes. Access to the interior of the cell is provided in the form of a door 13 and electrical feeds through the cell walls are provided by an electrical distribution box 14.

The GTEM! can operate up to 20 GHz but is expensive and is very large.

OBJECT OF THE INVENTION

It is an object of the present invention to provide an EMC test apparatus capable of operating at at least 1 GHz which is compact and inexpensive.

SUMMARY OF THE INVENTION

The present invention provides EMC test apparatus which comprises an electromagnetic screening enclosure for receiving electronic equipment in which is arranged a stripline antenna. The stripline antenna is suspended within and extends across the enclosure and has a width of less than half the wavelength of the highest frequency of the electromagnetic radiation at which EMC testing is to take place. Feedthrough connectors are provided to connect the stripline antenna to EMC test electronics.

By using the stripline antenna design, the present invention is able to generate higher frequency electromagnetic radiation than the standard TEM cell. In order to ensure that the necessary homogeneous electromagnetic field is generated the stripline antenna must have a width of less than half the wavelength of the highest frequency of the electromagnetic radiation in order to avoid transverse resonances. In its simplest form the present invention provides a stripline antenna comprising a single element. However, this provides a limited area which can generate a uniform electromagnetic field and therefore the size of the electronic equipment which can be tested using this arrangement is limited. In order to provide an increased surface area and hence an increased volume into which electronic equipment can be tested within a uniform electromagnetic field, the stripline antenna can comprise a number of parallel elements extending across the enclosure. These elements can be provided either by furcating the stripline e.g. bifurcating the stripline by providing a slotted aperture provided along a midline of the stripline, or by providing a plurality of stripline antennae electrically connected and arranged in parallel in a plane in the enclosure. In this arrangement the length of the furcations or the individual striplines must be substantially the same. Where the stripline is furcated, it is more difficult to provide equal length elements for anything other than two elements but so long as the length of the elements is equal to within one-tenth of the wavelength of the highest frequency of the electromagnetic radiation the differences in length will have a negligible effect.

Where the stripline comprises a plurality of striplines arranged in parallel power distribution means is necessary to either divide the electromagnetic power provided to the striplines during susceptibility testing or to combine the detected electromagnetic power from the stripline antenna during electromagnetic emission testing of electronic equipment.

Thus, by providing a plurality of elements by furcation or by providing parallel stripline antennae it is possible to provide test apparatus having an increased capacity to receive large pieces of electronic equipment for EMC testing. By effectively splitting up the antenna into separate parallel elements each having a width of less than half the wavelength of highest frequency electromagnetic radiation, it is possible to increase the effective area of the uniform electromagnetic field without severely reducing the homogenity of the field due to transverse resonant modes.

Conveniently the enclosure of the present invention is a cuboid box having a hinged opening allowing easy access to the interior of the box. Electromagnetic gasket material is provided around the opening to ensure good electromagnetic sealing. Since the box is designed to be substantially cuboid the maximum interior capacity of the test equipment is provided whilst minimising the overall bulk of the apparatus. In view of the shape of the enclosure, cavity resonances can be present at higher frequencies and these are dealt with by a combination of the provision of electromagnetic aborptive material and calibration of the apparatus.

The design features of the present invention which make it ideally suited for easy operation and transportability are that the enclosure is formed as a box in two halves which are hingedly connected together. The hingedly connected parts can be separated and the individual parts are dimensioned so as to allow them to fit through doorways of standard size.

Within the enclosure the electronic equipment to be tested is supported above the stripline antenna on an electromagnetic transparent platform. Electrical feeds through the enclosure wall are provided to allow electrical connection through the enclosure to the electronic equipment.

The present invention thus provides a compact EMC test apparatus having a large capacity for electronic equipment relative to its external dimensions. The present invention thus provides a compact and inexpensive EMC test apparatus capable to operating to within the GHz region.

BRIEF DESCRIPTION OF THE DRAWINGS

FIG. 6 is a front view of the EMC test apparatus in accordance with the present invention, with the upper section in the closed position; and FIG. 7 is a schematic view of an alternative stripline antenna arrangement in accordance with the present invention.

DETAILED DESCRIPTION

Figure 1:
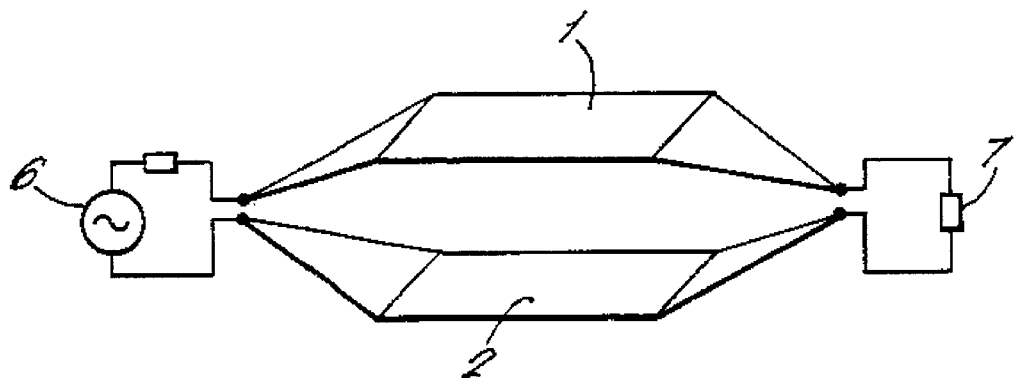
FIG. 1 is a schematic illustration of the open stripline TEM device disclosed in the European Standard.
Figure 2:
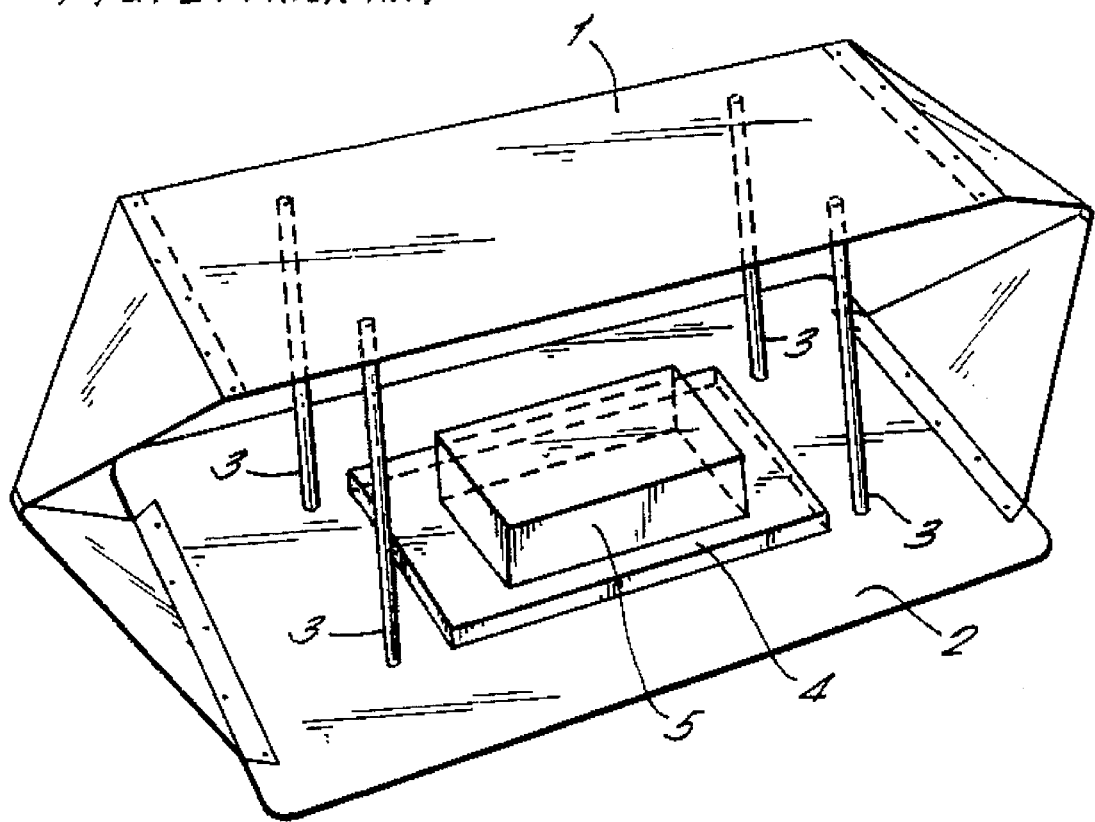
FIG. 2 is a specific construction of the open stripline TEM device proposed in the European Standard.
Figure 3:
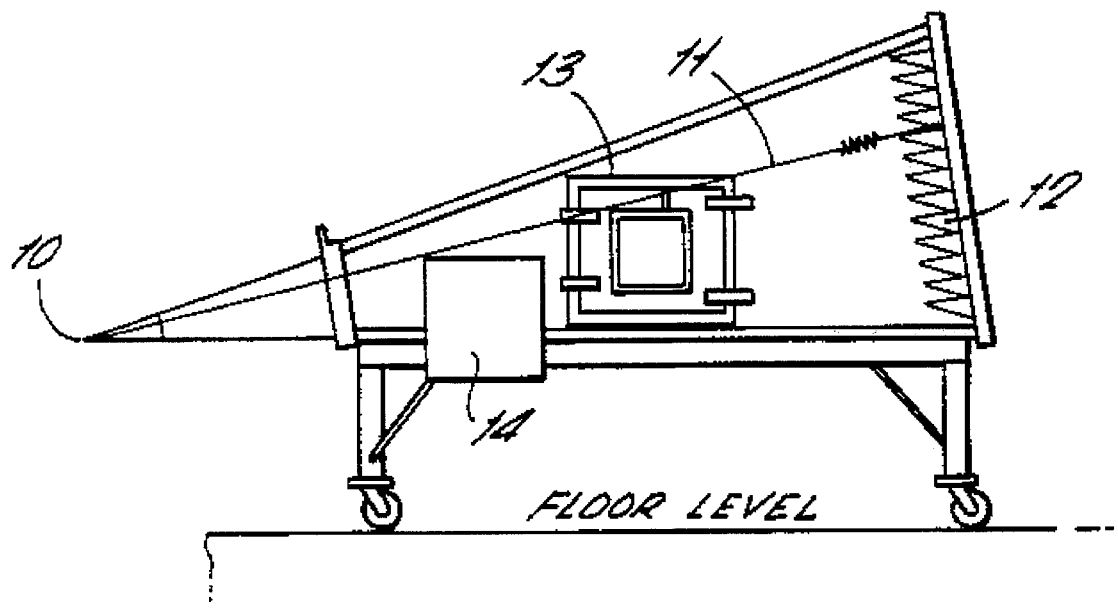
FIG. 3 is a schematic drawing of a TEM cell of the prior art which is capable of operating to within the GHz region.
Figure 4:
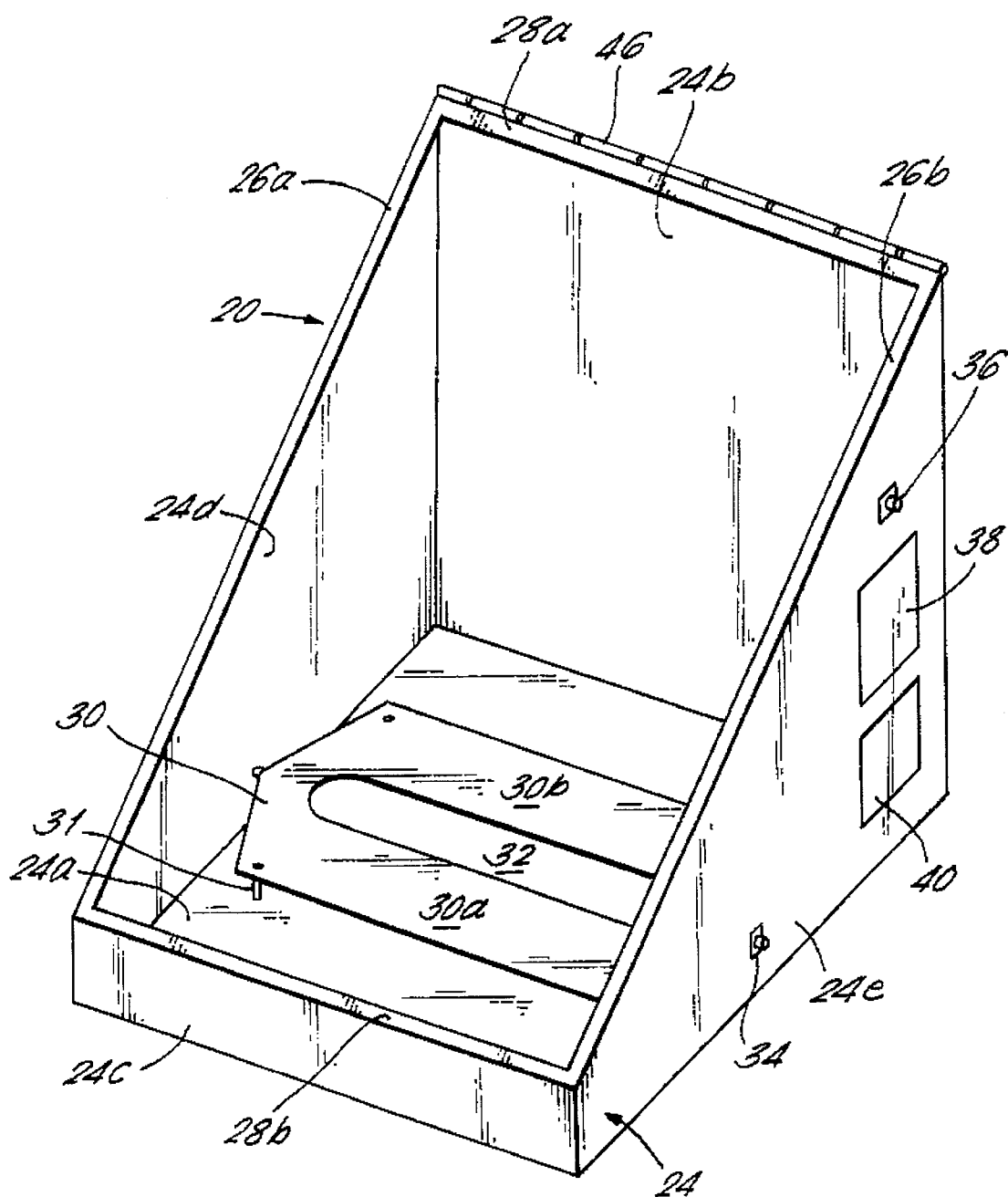
FIG. 4 is a perspective view of the lower section of the EMC test apparatus in accordance with the present invention.
Figure 5:
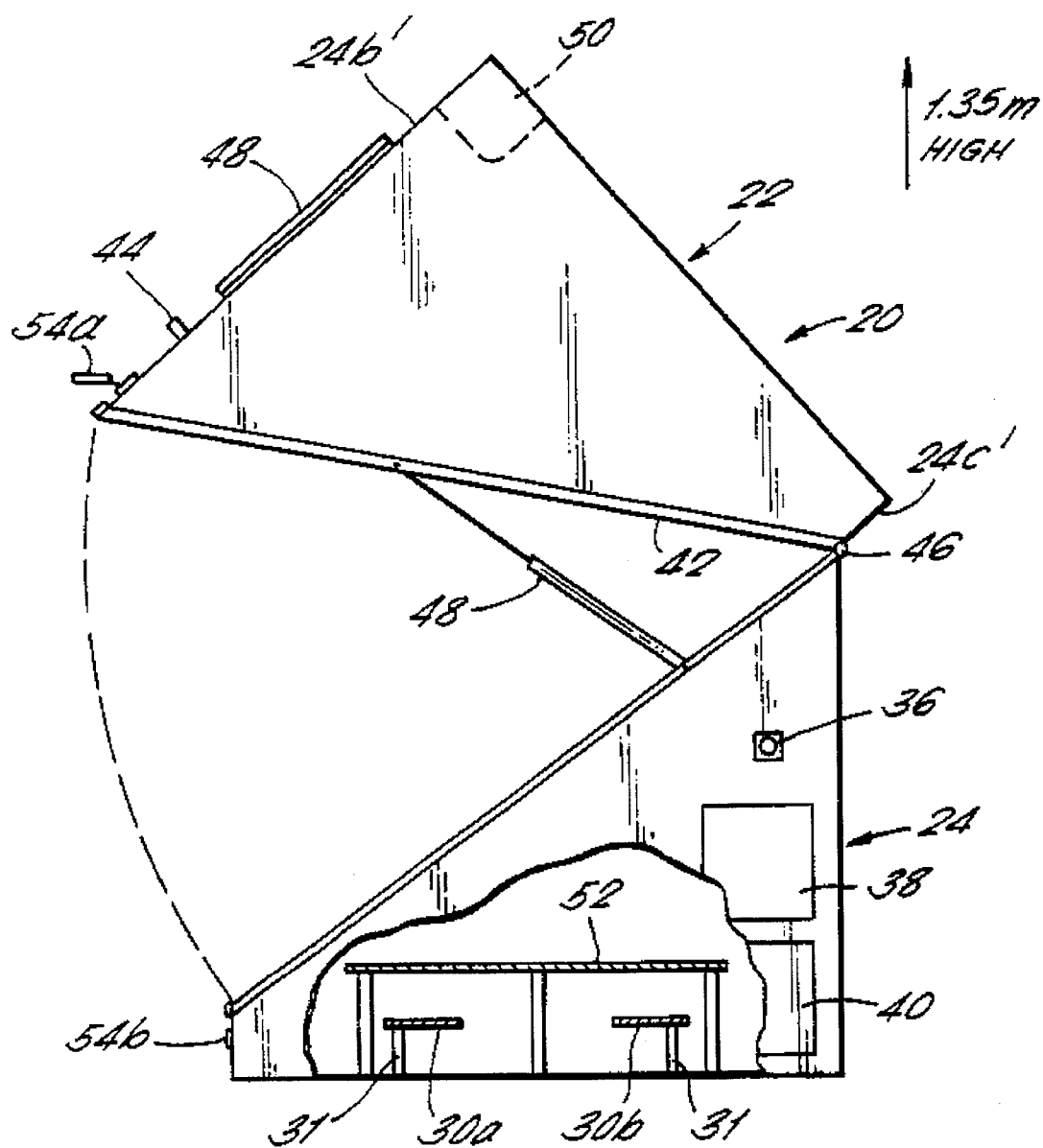
FIG. 5 is a part-sectional side view of the EMC test apparatus in accordance with the present invention, with the upper section shown in the open position.

Referring now to the drawings and initially to FIGS. 4, 5 and 6 which illustrate an exemplary embodiment of the EMC test apparatus of the present invention, the enclosure 20 is formed of two parts comprising an upper section 22 and a lower section 24. The lower section has a substantially rectangular base 24a, a rear vertical wall 24b and a front vertical wall 24c. The front vertical wall 24c is substantially shorter than the rear vertical wall 24b and the front and rear walls 24b and 24c are connected by side walls 24d and 24e such that side walls 24d and 24e have sloping upper edges 26a and 26b connecting the upper edges 28a and 28b of the rear and front vertical walls 24b and 24c respectively. The upper edges 26a, 26b, 28a and 28b comprise a flat surface to which a gasket on the upper section 22 mates when the upper and lower sections are in the closed position.

Thus the lower section 24 is formed as a sloping section box in which is arranged the stripline antenna 30 which comprises a bifurcated metallic plate having a slotted aperture 32 and two furcations 30a and 30b each of which is arranged to have a width of less than half the wavelength of the highest frequency of the electromagnetic radiation at which EMC testing is to take place. The test apparatus of this embodiment is designed to operate in the frequency range of 100 kHz to 1 GHz and thus the furcations 30a and 30b have a width of less than 15 cms.

The stripline antenna 30 is arranged to extend across the lower section 24 parallel to the base 24a and supported thereon by support members 31 formed of non-conductive material. The spacing of the stripline antenna 30 from the base 24a and from the upper section 22 affects the electromagnetic field strength available for testing. The stripline antenna is designed to provide a uniform field over as wider area as possible. The requirement to generate a uniform electromagnetic field over a wide area to enable EMC testing of large pieces of electronic equipment provides problems since if a stripline of a large width was used then transverse resonant modes would be set up which would affect the homogenity of the electromagnetic field. This is avoided in the present invention by the bifurcation of the stripline antenna. In order to ensure a uniform electromagnetic field it is necessary to keep the path lengths substantially the same. In each of the furcations 30a and 30b this can easily be obtained by bifurcating the stripline antenna 30. If a larger test area is required then further furcations would be needed in order to avoid transverse resonant modes. Alternatively, a plurality of individual stripline antennae could be used in place of the bifurcated stripline antenna 30 and this alternative arrangement will be described hereinafter.

The electromagnetic signal to generate the electromagnetic field within the enclosure 20 is provided from an RF supply (not shown) via leads (not shown) to electrical connections 34 through the side walls 20d and 20e of the lower section 24.

One of the side walls 20e is provided with a coaxial electrical connector 36 to allow for the screened electrical connection to the electronic circuit being EMC tested within the enclosure 20. The side wall 24e is also provided with enclosure electrical signal penetration panels 38 and 40 to allow for penetration of mains electricity through the enclosure 20 and to allow the user to adapt the panels for any necessary electrical feedthrough connections required for the electronic equipment being tested.

The upper section 22 comprises the same angled sectional shape as the lower section 24 and is arranged in a rotated and inverted position such that the equivalent wall 24c' to the front wall 24c is arranged at the rear of the enclosure 20 and is hingedly connected to the rear vertical wall 24b of the lower section 24. Thus when the upper section 22 and the lower section 24 are arranged together in a closed position they form a substantially cuboid box.

The upper section 22 although having the same general shape as the lower section 24, does not have any electrical feedthrough connections. The edges of the vertical walls of the upper section 22 have an electromagnetic gasket 42 formed thereon such that when the edges of the walls of the upper section 22 come into contact with the edges of the vertical walls of the lower section 24, the electromagnetic gasket 42 provides good electromagnetic screening.

Section 22 is also provided with a handle 44 to enable the upper section to be lifted and pivoted about the hinge 46. To facilitate the lifting of the upper section 22 and to ensure the upper section 22 is supported in an open position a gas strut 48 is provided connected to the side walls of the upper and lower sections 22 and 24. On the interior of the upper section 22 there is provided electromagnetic absorptive material (not shown). This material is provided to absorb electromagnetic radiation particularly at the frequency of the resonant modes of the enclosure. The upper section 22 is also provided with a window 48 to allow visual inspection of the electronic equipment during EMC testing. To further facilitate viewing of the electronic equipment during testing the upper section 22 is also provided with a light source 50 in a forward inner corner.

In FIG. 5 it can be seen that above the stripline antenna 30 comprising furcations 30a and 30b is provided a platform 52 which is formed of electromagnetic transparent material. This platform is not shown in the view of the lower section 24 shown in FIG. 4. The platform 52 is provided to support the electronic equipment in a plane above the stripline antenna during EMC testing.

Both the upper section 22 and the lower section 24 are provided with respective catch parts 54a and 54b forming a catch 54 to secure the upper and lower sections 22 and 24 in the closed position during testing.

The upper and lower sections 22 and 24 are separable by disconnecting the strut 48 and by removing the pin within the hinge 46. This allows for easy transportation of the EMC test equipment. As can be seen in FIG. 5, the overall height of the EMC test apparatus is 1.35 meters and when the upper and lower sections 22 and 24 are separated the height of the respective sections 22 and 24 is less than this allowing for them to pass through door frames of standard size. Thus, the design of the enclosure 20 provides not only efficient utilisation of space under simple construction, but also allows for easy dismantling and transportation.

In order to operate the EMC test apparatus external equipment is necessary for testing. When testing for the electromagnetic susceptibility of electronic equipment an electromagnetic source is required to be connected to one end of the stripline antenna and a terminating impedance connected to the other. The impedance of the transmission line is designed to be 50 ohms to avoid impedance mismatch between the coaxial cable from source which is conventionally 50 ohm impedance.

Data acquisition and analysis equipment is then required to be connected to the electronic equipment via various electronic feeds through the enclosure to analyse the susceptibility of the electronic equipment to the electromagnetic radiation throughout the spectral range at which analysis can be performed in the EMC test apparatus.

When the EMC test apparatus is used for determining the level of electromagnetic radiation emitted by electronic equipment, the electromagnetic signals detected by the stripline antenna are fed to data acquisition and analysis equipment to measure and analyse the electromagnetic radiation being emitted by the electronic equipment.

In view of the rectangular construction of the enclosure 20, above 300 MHz the enclosure exhibits resonances. These are dealt with in part by covering the interior of the top section 22 in RF absorbing material and in part by calibration. In order to calibrate the EMC test apparatus it is necessary to measure the RF field strength variation with frequency and generate compensation table to be used to compensate for the damped resonant modes.

FIG. 7 illustrates an alternative stripline antenna arrangement wherein the stripline antenna is composed of three stripline antennae 60a, 60b and 60c, each of which has a width of less than half the wavelength of the highest frequency electromagnetic radiation at which EMC testing is to take place. If the test apparatus is designed to operate at a maximum frequency of 1 GHz, the maximum width of each of the antennae 60a, 60b and 60c is 15 cms. The width of the centre antenna 60b may however be reduced in view of the coupling between the antennae 60a, 60b and 60c.

The antennae 60a, 60b and 60c are arranged to extend across the lower section 24 between the side walls 24d and 24e in the same manner as the bifurcated stripline antenna 30 shown in FIGS. 4 and 5. An electrical connection through the side walls 24d and 24e is provided by electrical connectors 61 and coaxial leads 62a, 62b and 62c are provided for connection from the connectors 61 to a power divider 63. For susceptibility testing one of the power dividers 63 is connected to an RF source and the other is connected to a terminating impedance.

In order to ensure that the path length from the power divider along each of the stripline antennae 60a, 60b and 60c is the same, the coaxial leads 62a, 62b and 62c are provided to have the same length. Thus, by providing a plurality of stripline antennae the breadth of the uniform field available for testing electronic equipment is increased without introducing transverse resonant modes. It should be noted that longitudinal resonant modes are not present along the stripline because they are naturally damped by the terminating impedance.

Whilst FIG. 7 illustrates only three stripline antennae, the present invention is not so limited. The present invention is applicable to the use of any number of parallel stripline antennae. Further, although FIGS. 4 and 5 illustrate the use of a bifurcated stripline, the present invention is not so limited. The present invention is applicable to a stripline furcated into any number of elements in order to provide a broad uniform electromagnetic field for EMC testing. Of course, where a plurality of separate stripline antennae elements or a plurality of furcations are provided each element or furcation must have a width of less than half the wavelength of the highest frequency of the electromagnetic radiation at which EMC testing is to take place.

It should be understood that the foregoing description of the present invention is meant to be illustrative only. Thus, although only a few examples of the present invention have been described in detail, it is clear that the features of the present invention may be adapted to many different situations without departing from the spirit of the present invention.

What is claimed is:

1. Test apparatus for one of testing the susceptibility of electronic equipment to electromagnetic radiation and measuring radiation emitted by electromagnetic radiation equipment, the apparatus comprising an electromagnetic screening enclosure for receiving said electronic equipment; a stripline antenna suspended within said enclosure and extending thereacross, said stripline antenna comprising a furcated stripline, each furcation occupying a common plane and each furcation having a width of less than half the wavelength of the highest frequency of the electromagnetic radiation at which one of testing and measuring is to take place and substantially the same length; and connection means connected to said stripline and said enclosure for connection to one of an electromagnetic radiation, source and electromagnetic radiation measurement means.

2. Test apparatus as claimed in claim 1 wherein said furcations are equal in length to within one-tenth of the wavelength of the highest frequency of the electromagnetic radiation at which one of testing and measuring is to take place.

3. Test apparatus as claimed in claim 1 wherein said stripline comprises a bifurcated stripline formed of a conductive sheet with a slotted aperture provided along a midline thereof.

4. Test apparatus as claimed in claim 1 including electromagnetic absorptive material provided on an inner surface of at least a part of said enclosure.

5. Test apparatus as claimed in claim 1 wherein said enclosure comprises a box formed of electrically conductive material, said box having a hinged opening part allowing access to the interior of said box, and an electromagnetic gasket material on at least one of said box and said opening part for providing an electromagnetic seal when said opening part is closed.

6. Test apparatus as claimed in claim 1 including an electromagnetic transparent platform arranged within said enclosure above said stripline antenna and adapted to support said electronic equipment during one of testing and measuring.

7. Test apparatus as claimed in claim 1 including support means for said stripline antenna comprising legs formed of non-conductive material.

8. Test apparatus as claimed in claim 1 including electromagnetic field strength measuring means for measuring the field strength within said enclosure over the frequency range of the electromagnetic radiation at which one of testing and measuring is to take place, and compensation means for receiving the measured field strength and determining a compensation table for use in the compensation for field strength variations with frequency.

9. Test apparatus as claimed in claim 1 wherein said enclosure comprises a substantially cuboid box formed of a lower section and an upper section, said lower section having a substantially rectangular base, a first vertical wall rising from the rear of said base, a second vertical wall rising from the front of said base opposed and substantially shorter than said first vertical wall, and vertical side walls rising from sides of said base and having sloping upper edges joining upper edges of said first and second vertical walls, said stripline antenna being arranged in said lower section parallel to said base and extending between said vertical side walls, said upper section being constructed to have substantially the same shape as said lower section but being arranged in a rotated and inverted position having the edge of said second vertical wall of said upper section hingedly connected to the edge of said first vertical wall of said lower section such that when said lower and upper sections are closed to form said substantially cuboid box said edges of said vertical walls of said lower section are in contact with said edges of said vertical walls of said upper section; said enclosure including an electromagnetic gasket provided between said edges of said upper and lower sections for electromagnetic screening.

10. Test apparatus as claimed in claim 9 including support means connecting said upper and lower sections to support said upper section in an open position.

11. Test apparatus as claimed in claim 9 wherein said enclosure includes electronic equipment connection means comprising connections to feed electrical connections to and from said electronic equipment through said enclosure.

12. Test apparatus as claimed in claim 9 including fastening means to fasten said upper and lower sections in a closed position.

13. Test apparatus as claimed in claim 9 including at least one window to allow the visual inspection of said electronic equipment during one of testing and measuring.

14. Test apparatus as claimed in claim 9 including a source of light within said upper sections.

15. Test apparatus for one of testing the susceptibility of electronic equipment to electromagnetic radiation and measuring radiation emitted by electromagnetic radiation equipment, the apparatus comprising an electromagnetic screening enclosure for receiving said electronic equipment; a stripline antenna suspended within said enclosure and extending thereacross, said stripline antenna comprising a plurality of antennas arranged in parallel and occupying a common plane, each of the antennas having a width of less than half the wavelength of the highest frequency of the electromagnetic radiation at which one of nesting and measuring is to take place; power distribution means for providing one of dividing the electromagnetic power between said stripline antennas and combining the electromagnetic power from said stripline antenna; and connection means connected to said stripline antenna and said enclosure for connection to one of an electromagnetic radiation source and electromagnetic radiation measurement means.

16. Test apparatus as claimed in claim 15 including electromagnetic absorptive material provided on an inner surface of at least a part of said enclosure.

17. Test apparatus as claimed in claim 15 wherein said enclosure comprises a box formed of electrically conductive material, said box having a hinged opening part allowing access to the interior of said box, and an electromagnetic gasket material on at least one of said box and said opening part for providing an electromagnetic seal when said opening part is closed.

18. Test apparatus as claimed in claim 15 including an electromagnetic transparent platform arranged within said enclosure above said stripline antenna and adapted to support said electronic equipment during one of testing and measuring.

19. Test apparatus as claimed in claim 15 including support means for said stripline antenna comprising legs formed of non-conductive material.

20. Test apparatus as claimed in claim 15 including electromagnetic field strength measuring means for measuring the field strength within said enclosure over the frequency range of the electromagnetic radiation at which one of testing and measuring is to make place, and compensation means for receiving the measured field strength and determining a compensation table for use in the compensation for field strength variations with frequency.

21. Test apparatus as claimed in claim 15 wherein said enclosure comprises a substantially cuboid box formed of a lower section and an upper section, said lower section having a substantially rectangular base, a first vertical wall rising from the rear of said base, a second vertical wall rising from the front of said base opposed and substantially shorter than said first vertical wall, and vertical side walls rising from sides of said base and having sloping upper edges joining upper edges of said first and second vertical walls, said stripline antenna being arranged in said lower section parallel to said base and extending between said vertical side walls, said upper section being constructed to have substantially the same shape as said lower section but being arranged in a rotated and inverted position having the edge of said second vertical wall of said upper section hingedly connected to the edge of said first vertical wall of said lower section such that when said lower and upper sections are closed to form said substantially cuboid box said edges of said vertical walls of said lower section are in contact with said edges of said vertical walls of said upper section; said enclosure including an electromagnetic gasket provided between said edges of said upper and lower sections for electromagnetic screening.

22. Test apparatus as claimed in claim 21 including support means connecting said upper and lower sections to support said upper section in an open position.

23. Test apparatus as claimed in claim 21 wherein said enclosure includes electronic equipment connection means comprising connections to feed electrical connections to and from said electronic equipment through said enclosure.

24. Test apparatus as claimed in claim 21 including fastening means to fasten said upper and lower sections in a closed position.

25. Test apparatus as claimed in claim 21 including at least one window to allow the visual inspection of said electronic equipment during one of testing and measuring.

26. Test apparatus as claimed in claim 21 including a source of light within said upper section.

\* \* \* \* \*

UNITED STATES PATENT AND TRADEMARK OFFICE
CERTIFICATE OF CORRECTION

PATENT NO. : 5,585,808
DATED : December 17, 1996
INVENTOR(S) : Richard Anthony Wysome et al.

It is certified that error appears in the above-indentified patent and that said Letters Patent is hereby corrected as shown below:

Column 7, line 33, cancel ",".

Column 9, line 13, cancel "make" and insert --take--.

Signed and Sealed this

Tenth Day of June, 1997

BRUCE LEHMAN

Attest:

Attesting Officer

Commissioner of Patents and Trademarks